United States Patent [19]

Akagi et al.

[11] 3,917,794

[45] Nov. 4, 1975

[54] METHOD OF PATTERN FORMATION

[75] Inventors: Motoo Akagi; Yoichi Oba; Takahiro Kohashi, all of Hachioji; Hazime Morishita, Tokyo; Toyoaki Kimura, Nagoya; Saburo Nonogaki; Mitsuru Oikawa, both of Tokyo; Yoshiro Otomo, Mitaka; Yoshifumi Tomita, Mobara, all of Japan

[73] Assignee: Hitachi, Ltd., Japan

[22] Filed: Jan. 26, 1973

[21] Appl. No.: 327,159

[30] Foreign Application Priority Data

Jan. 26, 1972 Japan .................................. 47-9094

[52] U.S. Cl. ..................... 427/68; 96/35.1; 96/36.1; 96/38.3; 313/109; 427/157

[51] Int. Cl.$^2$...... B05D 5/12; H01J 1/54; H01J 9/22

[58] Field of Search............... 117/33.5 CM, 33.5 C; 96/36.1, 36, 35.1; 313/109; 427/68, 157

[56] References Cited

UNITED STATES PATENTS

| | | | |
|---|---|---|---|
| 3,558,310 | 1/1971 | Mayaud | 96/36.1 |
| 3,615,460 | 10/1971 | Lange | 117/33.5 CM |
| 3,615,462 | 10/1971 | Szegho et al. | 117/33.5 CM |
| 3,623,867 | 11/1971 | Saulnier | 96/36.1 |
| 3,658,530 | 4/1972 | Hedler et al. | 117/33.5 CM |
| 3,676,127 | 7/1972 | Protzman et al. | 96/36.1 |
| 3,677,758 | 7/1972 | Kaplan | 96/36.1 |
| 3,712,815 | 1/1973 | Rohrer et al. | 96/36.1 |
| 3,734,731 | 5/1973 | Jones et al. | 96/36.1 |
| 3,788,846 | 1/1974 | Mayaud et al. | 96/36.1 |

*Primary Examiner*—William R. Trenor
*Attorney, Agent, or Firm*—Craig & Antonelli

[57] ABSTRACT

On a reciprocity-law failing photoresist layer, a pattern having an area smaller than that irradiated by light can be formed by exposing the photoresist layer through a mask having a desired pattern to suitable light and by developing the light-exposed layer according to an ordinary photochemical process. By applying the reciprocity-law failing photoresist layer in the production of a phosphor screen for a black matrix color picture tube, phosphor dots for three primary colors, each having a diameter smaller than that of each beam aperture of the shadow mask used in the color picture tube, can be formed, free from interconnection, without resorting to such a special method as repeated etching of shadow mask so that an excellent phosphor dot screen for a black matrix color picture tube can be provided.

22 Claims, 9 Drawing Figures

METHOD OF PATTERN FORMATION

The present invention relates to a method of forming a pattern, and more particularly of forming phosphor dots for three primary colors on the phosphor screen of a color picture tube.

In a conventional color picture tube of shadow mask type, phosphor for three primary colors, i.e. red R, green G and blue B, in a desired shape such as small round dots are formed on the inner surface of the face plate of the color picture tube and the phosphor dots are scanned by an electron beam having a diameter slightly smaller than the diameter of any phosphor dot to cause these dots to fluoresce.

For example, in and near the center of the phosphor screen of a 19-inch color picture tube phosphor dots, each having a diameter of about 0.34 mm, are scanned by an electron beam having a diameter of about 0.26 mm and are caused to fluoresce.

In order to prevent external lights from being reflected from the phosphor screen of such a conventional color picture tube, a glass having a poor light permeability, e.g. dark tint glass, was used as a face plate. As a result of this, the brightness and the contrast were deteriorated.

For eliminating these drawbacks, a black matrix color picture tube has been proposed in which the diameter of each phosphor dot is smaller than that of the scanning electron beam and in which spaces between phosphor dots are filled with a light-absorbing material such as carbon.

For example, in a 19-inch black matrix color picture tube, an electron beam having a diameter of about 0.34 mm scans the phosphor screen interspersed with phosphor dots having a diameter of about 0.26 mm with carbon applied to the space among the phosphor dots.

The black matrix color tube has such advantages as follows. Since the three electron beams for red, green and blue lights from the triple electron guns hit precisely the corresponding red, green and blue phosphor dot, color purity as well as contrast can be improved. The carbon applied among the phosphor dots, which serves to absorb external light, enables a glass having a high transparency to be used as a face plate so that the brightness of the displayed picture on the black matrix color tube is approximately twice as high as that of the color picture tube of the other type.

If in a shadow mask type color picture tube the proper position of the beam apertures of the shadow mask relative to the phosphor dots is erroneously deviated, color reproducibility is deteriorated due to the deviation of the electron beams from the corresponding phosphor dots or the beams hitting the wrong phosphor dots. It is for this reason that the same shadow mask that was used to form phosphor dots on the phosphor screen of a color tube, has to be incorporated in the completed color picture tube. Especially in case of a black matrix color picture tube, phosphor dots having diameters smaller than those of the corresponding scanning electron beams, i.e. the diameters of beam apertures of the shadow mask that is to be incorporated in the color tube, have to be formed on the inner surface of the face plate with the aid of the same shadow mask that is to be employed in the completed picture tube.

The post-etching method has been proposed to solve the problem concerning the formation of the phosphor dots and the arrangement of the shadow mask.

According to the post-etching method, the phosphor screen is formed by using a shadow mask having small beam apertures (with the space among phosphor dots filled with non-luminescent, light-absorbing material such as carbon). The shadow mask that was used to form the phosphor dot screen is then subjected to etching with a suitable acid to make the diameters of the apertures of the shadow mask larger so that the shadow mask together with the phosphor dot screen is assembled in a completed color picture tube of black matrix type.

In this way, phosphor dots having a diameter smaller than that of the scanning electron beam can be realized. However, this method cannot be free from the following drawbacks because of etching the shadow mask with acid. First, the shape of each beam aperture is liable to be deformed since the side wall portion of the aperture is etched by the acid without any suitable control. Secondly, the oxide film coated on the shadow mask for heat dissipation is, often, partially etched away. Thirdly, structural distortion tends to be caused in the shadow mask during heat treatment after etching. Further, if a shadow mask proves unusable after a phosphor screen is completed, the shadow mask together with the phosphor screen is useless since no other shadow mask can be combined with the phosphor screen.

Another conventional method proposed is an optical one wherein no post-etching is carried out. In this optical method, a special light source such as ring-shaped or rotating light source is used to form phosphor dots for three primary colors and thereby a phosphor screen having phosphor dots, each having a diameter smaller than that of the beam aperture of a shadow mask, can be formed without post-etching the shadow mask.

The optical method is indeed superior to the post-etching method in that the etching of the shadow mask after the completion of the phosphor screen is needless, but there is left a problem that a specific light source must be prepared and that the quality of the photoresist agent to be used affects the faculty of the finished color picture tube.

Namely, in the conventional optical method using a photoresist agent of polyvinyl alcohol (PVA) - ammonium dichromate (ADC), the light spots projected on the photoresist layer in triple exposure for forming phosphor dots for three primary color even with such special light source as described above cannot be prevented from overlapping one another in order to obtain a desired brightness and a high electron-beam "landing allowance" (the maximum permitted deviation of the electron-beams from the corresponding phosphor dots). As a result, a phenomenon that adjacent phosphor dots corresponding to different primary colors are joined with one another, tends to be caused. This is an unavoidable drawback with the conventional optical method.

The object of the present invention is to provide a method of forming a pattern, which can solve the problems encountered by the conventional method of producing a color picture tube of black matrix type and according to which phosphor dots each having a diameter smaller than that of the beam aperture of the shadow mask can be formed without resorting to post-etching.

In order to attain the above object, a reciprocity-law failing photoresist layer has to be used and at the same time light exposure must be performed under conditions where the value of the Schwarzschild constant p is such that $0 < p < 0.76$. Consequently, the crosslinking reaction in a portion of photoresist layer where the amount of irradiating light is less than a certain value, can be suppressed so that phosphor dots for three primary color R, G and B, each having a diameter smaller than that of each beam aperture of the shadow mask can be formed very precisely and without interconnection.

In this specification, for convenience sake, cases are described where round phosphor dots are formed. It is a matter of course that dots having a desired shape, e.g. elliptical or rectangular or square, can be formed if the shape of beam apertures of the shadow mask is accordingly selected. Therefore, it should be noted that the present invention is not limited to the embodiments described in the specification.

Hereunder, this invention is described in detail with reference to the accompanying drawings, in which.

An example of a procedure for manufacturing a phosphor dot screen used in a black matrix type color picture tube, is given below according to steps in the order taken in practice.

1. A photoresist material is applied onto the inner surface of a face plate and subjected to desiccation.

2. A shadow mask is properly arranged with respect to the face plate and light is projected on the photoresist layer through the beam apertures of the shadow mask to form R, G and B phosphor dots for three primary colors.

3. The shadow mask is removed and the photoresist layer after light exposure is then subjected to developing treatment with water so that photoresist dots are left behind.

4. A colloidal carbon black solution is applied to the inner surface of the face plate and then dried up.

5. The face plate with carbon film thereon is washed by a chemically digestive solution so that the photoresist dots together with carbon coating the dot portions of the photoresist layer are digested away to form matrix holes in the carbon layer on the photoresist layer.

6. Phosphor dots R, G and B for three primary colors are formed by successively applying phosphors in slurry for R, G and B dots into the corresponding matrix holes, and by subjecting the face plate to exposure and development.

7. The following steps such as alminizing, frit baking and mounting of electron guns are the same as in the conventional procedure.

Figure 1A:
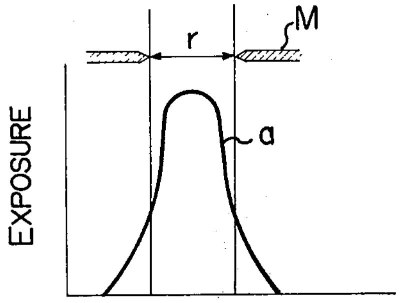
FIG. 1A is a graphical representation of the exposure or the amount of light projected upon a photoresist film through one beam aperture having a radius of $r$ of a shadow mask M.
Figure 1B:
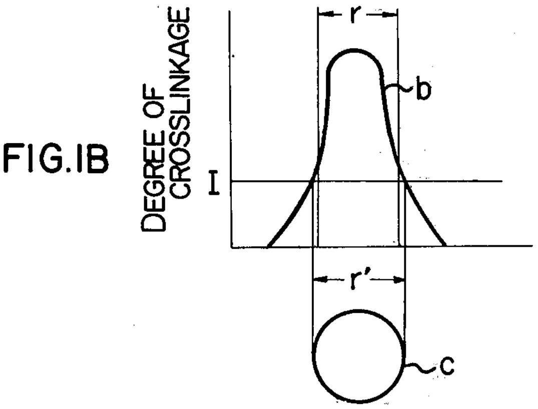
FIGS. 1B and 1C are graphical representations of the progress of the crosslinking reaction respectively in a photoresist film following the reciprocity-law and a reciprocity-law failing photoresist film, due to light projection as shown in FIG. 1A.

FIG. 1A shows the total accumulated amount of light projected upon a photoresist layer of a face plate in the case of ultraviolet exposure through a shadow mask M having beam apertures with a diameter of $r$. The exposure, i.e. the amount $a$ of light irradiating the photoresist layer assumes a maximum value at the center of the beam aperture and decreases with the distance from the center outward, as is apparent from FIG. 1A. In this case, not only the portion of the photoresist layer corresponding and equal to the area of the beam aperture is exposed to light but also the outer periphery of the portion is irradiated by light to some extent. Therefore, in case where a conventional photoresist material is used, crosslinkage takes place, as shown in FIG. 1B. Namely, with such a conventional photoresist as ammonium dichromate - polyvinyl alcohol, the total accumulated amount of light is almost proportional to the degree of crosslinkage and therefore the profile $a$ of the total amount of light is almost the same as the profile $b$ of the degree of crosslinkage. In this way, the size of a phosphor dot formed in this case is indicated by a circle $c$ with a diameter $r'$ which is larger than the diameter r of beam aperture of the shadow mask, as shown in FIG. 1B, where I indicates the minimum degree of crosslinkage required to form phosphor dots. On the other hand, in case of a reciprocity-law failing photoresist material, a quite different result can be obtained.

In a reciprocity-law failing photoresist layer, the degree of crosslinkage is not in proportion to the total accumulated amount of light and moreover the crosslinking reaction only occurs a little unless the amount of light exceeds a certain level. So, the profile $a$ of the amount of light is different from the profile $b'$ of the degree of crosslinkage.

Namely, in the reciprocity-law failing photoresist layer, the slope of curve for the profile $b'$ of the degree of crosslinkage is steep near the center of the beam aperture and the degree of crosslinkage decreases remarkably with the distance from the center outward. Therefore, the degree of crosslinkage in the vicinity of the periphery of the beam aperture cannot reach the minimum value I necessary to form a phosphor dot so that the resultant dot $c'$ has a diameter $r''$ smaller than the diameter r of the beam aperture.

The reciprocity-law failing property was supposed in the past to be unsuitable for photoresist material and a reciprocity-law failing photoresist material has not been used hitherto for the purpose in question. The present invention may well be said to have introduced a reformation in the field of the art. Namely, it enabled phosphor dots having a diameter smaller than the diameter of the beam aperture of the shadow mask to be formed through the use of a reciprocity-law failing photoresist material which had been condemned as unfavorable and without resorting to such a special technique as post-etching method.

Next, description will be made of how the interconnection between phosphor dots can be prevented by using such a reciprocity-law failing photoresist material.

Figures 2A, 2B, 2C:
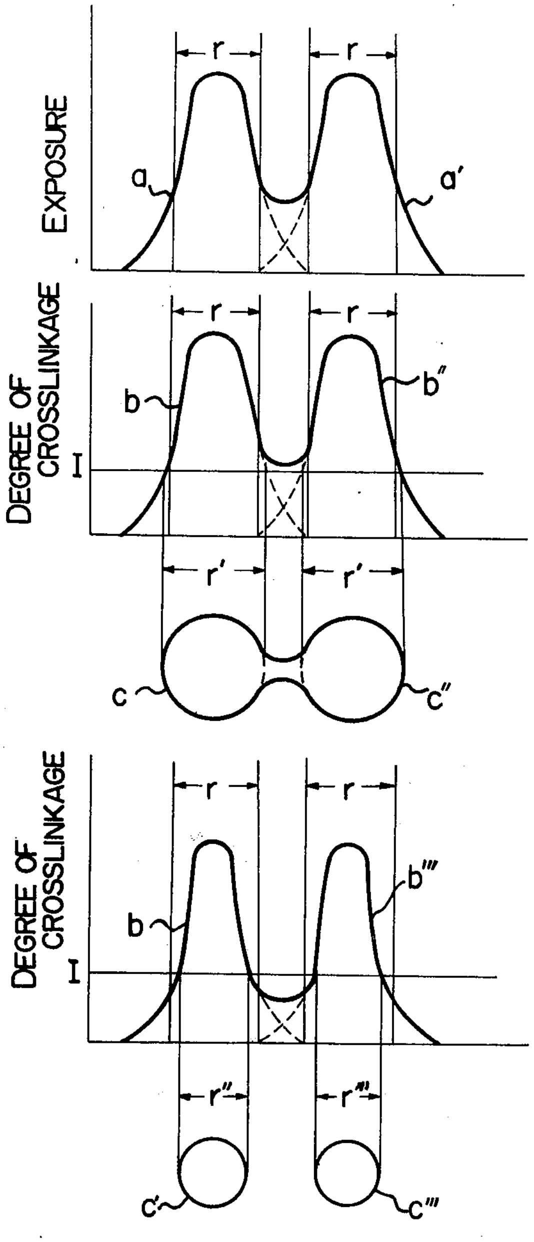
FIG. 2A is a graphical representation of the amount of light projected on the adjacent parts of a photoresist layer.
FIGS. 2B and 2C are graphical representations of the progress of the crosslinking reaction respectively in a reciprocity-law holding photoresist layer and a reciprocity-law failing photoresist layer, due to the light projection as shown in FIG. 2A.

FIG. 2A shows the amount of light projected on the adjacent portions of photoresist layer where phosphor dots are to be formed through triple exposure of light through a shadow mask having beam apertures with a diameter of $r$. In FIG. 2A, the profiles $a$ and $a'$ are respectively the amount of light cast on the adjacent portions to be turned into phosphor dots. The overlapping portions of the profiles $a$ and $a'$ in FIG. 2A are superposed upon each other, the dotted curves in FIG. 2A showing the overlapping portions of the individual profiles $a$ and $a'$. Accordingly, as seen in FIG. 2B, the overlapping portions of the degree of crosslinkage $b$ and $b''$ indicated by dotted curves of a conventional photoresist material are superposed on each other. And when the superposed portion of the degree $b$ and $b''$ exceeds the level I, the adjacent two dots $c$ and $c''$ are joined to form crosslinkage.

On the other hand, with a reciprocity-law failing photoresist material according to the present invention, the degree of crosslinkage around each dot is very small and the overlapping portion of the profiles $b'$ and $b'''$ is below the level I, so that the two adjacent dots $c'$ and $c'''$ can be independently formed without being joined or interconnected together.

It is apparent that the brightness of the phosphor screen of a color picture tube is determined by the diameter of each phosphor dot if the diameter of the scanning electron beam (determined by the diameter of the beam aperture of the shadow mask) is set constant. Therefore, in order to merely increase the brightness, it is only necessary to make the diameter of the phosphor dot as large as possible within an upper limit of $r$ which is the diameter of the beam aperture.

As described above, however, in case of a black matrix type color picture tube, interconnection between phosphor dots due to overlapping effect of irradiating light prevented the brightness from being increased by increasing the diameter of each dot.

Figure 3A:
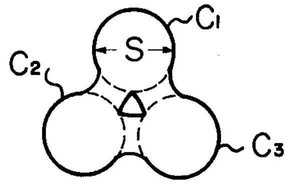
FIGS. 3A and 3B show phosphor dots formed in a reciprocity-law holding photoresist layer and FIG. 3C shows phosphor dots formed in a reciprocity-law failing photoresist layer.
Figure 3B:
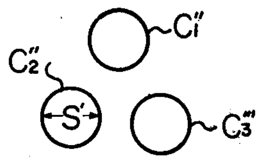
Figure 3C:
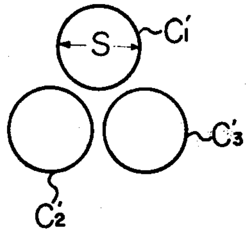

Namely, as shown in FIG. 3A, if the diameter S of each of phosphor dots $c_1$, $c_2$ and $c_3$ for three primary colors R, G and B is made larger than a certain value in order to obtain a high landing allowance with a conventional photoresist material, then interconnection are formed between the phosphor dots. And the only way to avoid such interconnection is to form phosphor dots $c_7''$, $c_2''$ and $c_3''$ each having a smaller diameter S', as shown in FIG. 3B. If a reciprocity-law failing photoresist material is used according to the present invention, rather larger phosphor dots $c_1'$, $c_2'$ and $c_3'$ can be formed, as shown in FIG. 3C, without being joined together.

Therefore, according to the present invention, there is provided a color picture tube having a brightness higher than that according to the conventional optical method.

Now, detailed description will be given to the condition under which phosphor dots can be formed free from interconnection by using a reciprocity-law failing photoresist material.

Assuming that the intensity of light is represented by $i$, the time of exposire by $t$ and the resultant degree of crosslinkage by B, then one will find the functional relation between $i$, $t$ and B such that, in case of a conventional photoresist material having a profile $b$ as shown in FIG. 1B

$$B = f(i.t) \qquad (1).$$

Figure 1C:
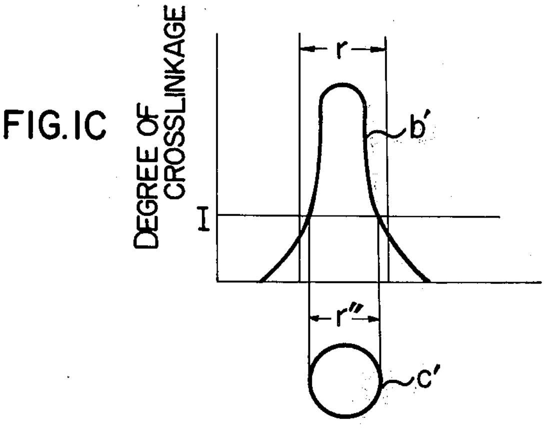

On the other hand, for a reciprocity-law failing photoresist material having a profile $b'$ as shown in FIG. 1C, it follows that $$B = f(i.t^p) \qquad (2).$$

where the power index $p$ is the Schwarzschild's constant such that $0 < p < 1$. The explicit form of the function for the expression (1) or (2) is not determined, but since the degree of crosslinkage within a range of practical total accumulated amount of light is supposed to be proportional to the time of exposure in the case of a conventionally used photoresist material such as ammonium dichromate - polyvinyl alcohol or a photoresist material used in the present invention, the expressions (1) and (2) can be replaced respectively by the following expressions $$B = ki \cdot t \qquad (1')$$

and $$B\ 32\ k'i\ \frac{1}{p}\ t \qquad (2')$$

where $k$ and $k'$ are constant coefficients, and the Schwarzschild's constant $p$ is such that $0 < p < 1$ as with the expressions (1) and (2). If $p = 1$ where the reciprocity-law holds, the expressions (1') and (2') are equivalent to each other.

In order to avoid the interconnection, it is necessary to render the value of $p$ as small as possible.

The value for $p$ suitable to embody the present invention can be determined as follows. Namely, the profiles $a$ and $a'$ of the amount of light irradiating the photoresist layer through the beam apertures of the shadow mask M are as shown in FIG. 2A. In practice, however, the superposed portion of the profiles $a$ and $a'$ at the middle point of the profiles $a$ and $a'$ assumes a value equal to 80 percent of that at the center of the profile $a$ or $a'$. Accordingly, in case where a conventional photoresist material is used, the degree of crosslinkage at the middle point between the dots will reach 80 percent of that at the center of the profile $a$ or $a'$. Therefore, if it is desired to form phosphor dots without interconnection, the quantity of exposure light must be so controlled that the minimum degree I of crosslinkage necessary for the formation of phosphor dots may lie within a very narrow range that is 80 to 100 percent of the total amount of irradiating light. The interconnection can not be prevented unless the above said requirement is satisfied, since otherwise the degree of crosslinkage at the middle point exceeds the minimum value I.

When the quantity of exposure light cannot be set within such a narrow range, the only way to make a choice is to reduce the diameter $r$ of each beam aperture of the shadow mask M while the pitch of the apertures is kept unaltered, to render the degree of crosslinkage at the middle point smaller than I. By doing this, however, the diameter $r'$ of the phosphor dot $c$ or $c''$ is reduced with the result that the brightness of the completed picture tube is sacrificed.

The value of 80 percent of the amount of light at the center of the profile $a$ or $a'$, which is attained at the middle point between the dots $c$ and $c''$, consists of two 40 percent contributions from the profiles $a$ and $a'$. When the conventional photoresist layer is irradiated by such a light as described above, the degree of crosslinkage at the middle point becomes 80 percent of that at the center of each dot. Under the same condition with a reciprocity-law failing material according to the present invention the degree of crosslinkage at the middle point between the dots is by far smaller than that at the center of each dot due to the reciprocity-law failing property characterized by the expression (2'). Thus, dot having a desired diameter can be easily formed without interconnection.

For, if a reciprocity-law failing material having a degree of crosslinkage at the middle point of dots equal to, say, 60 percent of that at the center of dot is employed, then the range of the condition for exposure light on the reciprocity-law failing photoresist material, i.e. 60–100 percent, is twice as large as that of the condition for exposure light on the conventional photoresist material, i.e. 80–100 percent. The superposed crosslinkage effect of 60 percent described above also consists of two 30 percent contributions of irradiating light upon the adjacent dots.

If the degree of crosslinkage at the middle point between dots can be set less than 60 percent of that at the center of each dot, high quality phosphor dots can be easily formed without interconnection. The Schwarzschild's constant $p$ in the expression (2') necessary to realize such a condition as described above may be derived as follows.

Let it be assumed that the intensity of irradiating light at the center of each dot and the associated degree of crosslinkage are respectively $i_0$ and $B_0$ and that the intensity of light at the middle point between dots and the associated degree of crosslinkage are respectively $i_1$ and $B_1$, then it follows that $$B = k' i_0^{\frac{1}{p}} t \qquad (3)$$

and $$B = k' i_1^{\frac{1}{p}} t \qquad (4)$$

Hence $$\frac{B_1}{B_0} = \left(\frac{i_1}{i_0}\right)^{\frac{1}{p}} \qquad (5)$$

Substituting $B_1 = 0.3B_0$ and $i_1 = 0.4i_0$ into the expression (5), one has $$0.3 = (0.4)^{\frac{1}{p}} \qquad (6)$$

Therefore, one obtains $$p = 0.76 \qquad (7)$$

Namely, the Schwarzschild's constant $p$ must be less than 0.76 so as to form high quality dots without interconnection in the case of a reciprocity-law failing photoresist, that is, $$0 < p < 0.76 \qquad (8)$$

Another feature of the reciprocity-law failing photoresist material according to the present invention is that the progress in the crosslinkage in the dark reaction after exposure is very slow.

For example, in the conventional photoresist material such as polyvinyl alcohol - ammonium dichromate, the progress in the crosslinkage in the dark reaction after exposure is very rapid and the crosslinkage region increases, so that the size of each dot is irregularly enlarged and it is impossible to form phosphor dots of a particular size.

On the other hand, the photoresist material used in the present invention experiences little dark reaction after exposure so that uniformly shaped phosphor dots can easily be formed without suffering from such difficulties as mentioned above.

In order to make the sizes of phosphor dots for three primary colors uniform to prevent non-uniformity in white color with the coventional technique in which the progress in the crosslinking reaction after completion of light irradiation cannot be completely stopped, it is necessary both to make the effective amount of irradiating light constant and to perform development work during a constant period. Moreover, since the interconnection is caused due to, for example, the increase in the region of crosslinkage owing to dark reaction, the period cannot exceed a certain limit.

According to this invention, the region of crosslinkage due to dark reaction does not increase and therefore it is only necessary to make the effective amount of irradiating light constant in order to make the sizes of phosphor dots uniform but there is no need for consideration of such developing period.

The photoresist material used in the present invention is composed of a high-molecular compound and crosslinkage agent and a binding promoter may be added to the photoresist material to strengthen the adhesion between the glass and the photoresist material and to improve the shape of the resultant matrix holes.

A polymer containing polyvinyl pyrrolidone and vinylpyrrolidone or a mixture of the polymer and at least one of water-soluble high-molecular compounds which can be dissolved in the polymer, can be used as such a high-moleculr compound for the photoresist material.

As the above-mentioned water-soluble high-molecular compounds are used a monopolymer of carboxymethylcellulose, hydroxymethylcellulose, sodium salt of poly-L-glutamate, gelatin, polyacrylamide, polyvinylmethylether, polyvinylalcohol, polyvinylacetal or polyethyleneoxide, a copolymer of acrylamide-diacetoneacrylamide, a copolymer of acrylamide-vinylalcohol, a copolymer of maleic acid-vinylmethylether, etc. A water-soluble bisazide compound such as 4,4'-diazidobenzalacetophenone-2-sulphonate, 4,4'-diazidostyl-benzene-2,2'-disulphonate, and 4,4'-diazidostyl-benzene-γ-carboxylic acid can be used as such a crosslinkage agent. And a water-soluble functional alcoxysilane such as vinyltoris (β-methoxyethoxy)silane, N-β(aminoethyl)-aminopropylmethyldimethoxysilane, N-β(aminoethyl)γ-aminopropyltrimethoxysilane can be used as such a binding promotor.

A chemically digestive agent is needed to remove hardened portion of the photoresist material in the process of forming phosphor dot screen and as such an agent is used an acid solution containing an oxidizer such as hypochloric acid, sodium hypochlorite, peroxosulfuric acid, potassium peroxosulfide, periodic acid, potassium periodate, bichromate (acid solution) such as potassium bichromate, or chromate such as potassium chromate.

The upper limit to the diameter of each beam aperture of a shadow mask having a mask pitch of 0.62 mm which is used to form at the central portion of a face plate phosphor dots having a diameter of 0.26 mm with well-known polyvinylalcohol-ammonium bichromate used as photoresist material is 0.34 mm for a post-etching method and 0.315 mm for a rotary exposure method.

On the other hand, according to the present invention in which a reciprocity-law failing photoresist material is used, phosphor dots having a diameter of 0.26 mm can be formed by using a shadow mask having beam aperture having a diameter of 0.35 mm, with either fixed or rotary light source and without performing post-etching.

Namely, in the conventional manufacturing method, landing allowance with rotary exposure light technique is smaller than with post-etching technique so that conditions required in the practical manufacturing process must be rigorously selected.

According to the present invention, a landing allowance higher than attained with the post-etching method can be realized without post-etching and phosphor dots having a desired diameter can be formed free from interconnection by using a shadow mask having beam aperture diameter larger than that of apertures of a conventional shadow mask, with the amount of irradiating light varied, so that there is no need for using a rotary light source. Moreover, a fixed light source is more preferable than a rotary light source for fabricating a color picture tube having a higher brightness and landing allowance in a shorter period of light exposure. Thus, some of drawbacks of the conventional method can be eliminated.

Now, several matters to which attention should be paid in embodying the present invention, will be mentioned.

The process in which crosslinking reaction takes place in the part of photoresist material irradiated by light, has to be carried out in an atmosphere containing oxygen gas.

It is well known by those skilled in the art that oxygen gas disturbs to a marked extent photo-polymerization and photo-crosslinkage reaction respectively when a material having photo-polymerization property polymerizes due to irradiation by light and when a material having photo-crosslinkage property is turned into an insoluble substance through crosslinking reaction taking place in the material due to irradiation by light.

For example, the sensitivity of the photoresist film KTFR (trade name), manufactured by Eastman Kodak Co., which is a photoresist agent turned soluble due to crosslinkage by light irradiation, when irradiated by light in contact with the air, has proved to be about 1/300 of the sensitivity of the same photorsist film when irradiated by light in the absence of oxygen with a mask for pattern formation closely superposed on the film. Therefore, in case where the KTFR is used, the film has to be irradiated by light either with a mask closely attached thereto or in an atmosphere of inert gas so as to prevent the influence of oxygen gas adversely affecting the sensitivity.

On the other hand, it is essential in the embodiment of the present invention in which the reciprocity-law failing property is utilized, to perform the irradiation by light of the photoresist film in an atmosphere containing oxygen. Namely, it is necessary with the conventional photoresist material to avoid the influence by oxygen, while the reciprocity-law failing photoresist material used in the present invention needs oxygen in the process of light irradiation. It is especially essential for a photoresist material containing at least one of the copolymers of polyvinylpyrrolidone and vinylpyrrolidone. This is one of the most remarkable features of the applicant's invention, that have not even suggested by the manufacturers in the field of the art.

EMBODIMENT 1

A mixture according to the following composition 1 is rotary sprayed onto a panel as a face plate and dried up.

| Composition 1 | |
|---|---|
| Polyvinylpyrrolidone (4% water solution) | 25 g |
| Polyacrylamide (1% water solution) | 60 g |
| 4,4'-Diazidostilbene-2,2'-sodium disulphonate | 320 mg |
| N-β(aminoethyl)γ-aminopropyl-trimethoxysilane | 16 μl |

Then, a shadow mask having beam apertures of 0.35 mm diameter and a mask pitch of 0.62 mm, is attached to the panel covered by the mixture. Light irradiations of 180 lux during 6 minutes (1.08 KLM) for red phosphor dots R, 220 lux during 4 minutes (0.88 KLM) for green dots G and 200 lux during 5 minutes (1.0 KLM) for blue dots B, are performed in an atmosphere of air at 1 atm. pressure with high pressure mercury vapor lamps at the three positions of light sources on a rotary platform corresponding to the respective dots R, G and B. Thereafter water spraying is done for about 2 minutes to perform developing treatment, which produces photo-hardened dots for three primary colors. After desiccation, carbon powder in slurry is applied to the surface of the panel where the photo-hardened dots are formed and then the applied carbon is dried up. The photo-hardened portions of the photoresist film are etched away by immersing the film for 3 minutes in a 1 percent water solution of sodium hypochlorite at 50°C and then the carbon layer at the dots is removed by chemical digestion to form a black matrix. The thus formed holes of the black matrix have a diameter of 0.26 mm near the center of the matrix. Finally, the application of phosphor material, alminizing, frit-baking and the mounting of electron guns on the bulb are performed according to the conventional technique to fabricate a black matrix color picture tube.

For the purpose of comparison, a black matrix color picture tube having the same hole diameter of 0.26 mm was fabricated, using a mask having the same mask pitch and according to the same procedure, with a conventional photoresist material, i.e. polyvinylalcohol - ammonium dichromate (hereafter referred to as PVA-ADC). The maximum diameter of the beam apertures of the mask used in this case was 0.315 mm and with a mask having a larger aperture diameter the interconnections were formed between phosphor dots. It has been proved in the previous comparison that in order to fabricate a black matrix color picture tube having a predetermined hole diameter, i.e. predetermined brightness, a mask having a larger aperture diameter can be used according to the present invention than according to the conventional method. Therefore, it is seen that according to the present invention a by far higher landing allowance can be attained.

EMBODIMENT 2

A black matrix color picture tube was fabricated, using a photoresist material specified by the composition 1 in the above embodiment 1 and a mask having a beam aperture diameter of 0.33 mm and a mask pitch of 0.62 mm, and according to the same procedure as in the embodiment 1. The light irradiation in this case for R, G and B phosphor dots was at 0.8–1.0 KLM. The resultant hole diameter was 0.33 mm at the center of the black matrix with no interconnection formed.

For comparison, a similar picture tube was fabricated using PVA-ADC and the same shadow mask and according to the same procedure. In this case the maximum hole diameter was 0.29 mm which corresponds to the maximum diameter of phosphor dots formed without interconnections. This comparison shows that a black matrix color picture tube having a higher working allowance and, if necessary, a higher brightness can be fabricated by using a photoresist material according to the present invention.

EMBODIMENT 3

A black matrix color picture tube was fabricated using the photoresist material specified by the following composition 2 and according to the same procedure as in the previous embodiment 1. However, in this case, the light irradiation for R, G and B dots was at 5.0–7.0 KLM and the etching of the photoresist layer in a 1 percent water solution of sodium hypochlorite was performed at 60°C for 20 minutes. The diameter of the resultant holes was 0.26 mm at the center of the black matrix.

| Composition 2 | |
|---|---|
| Polyvinylpyrrolidone (5% water solution) | 26 g |
| 4,4'-Diazidostilbene-2,2'-sodium disulphonate | 260 mg |
| N-β(aminoethyl)γ-aminopropyl-trimethoxysilane | 13 μl |

EMBODIMENT 4

Two black matrix color picture tubes were fabricated using such photoresist materials as specified by the composition 1 in the embodiment 1 and according to the same procedure as in the embodiment 1. In these cases, however, the ratios by weight of polyvinylpyrrolidone to polyacrylamide in the respective photoresist materials are 1.0:0.3 and 1.0:0.8 while the total weight percentage of the high-molecular compounds is kept unaltered, and the light irradiation for R, G and B dots was performed at 0.5–2.0 KLM. As a result of this, the diameter of the thus formed holes was 0.26 mm at the center of the completed black matrix in either case.

EMBODIMENT 5

A black matrix color picture tube was fabricated using such a photoresist material as specified by the following composition 3 and according to the same procedure as in the embodiment 1. In this case, however, the light irradiation for R, G and B dots was at 1.0–3.0 KLM, and the development with waterspray was carried out for about 30 seconds. The diameter of the resultant holes at the center of the matrix was 0.26 mm.

| Composition 3 | |
|---|---|
| Polyvinylpyrrolidone (5% water solution) | 20 g |
| Polyacrylamide (1% water solution) | 30 g |
| 4,4'-Diazidostilbene-2,2'-sodium disulphonate | 390 mg |

EMBODIMENT 6

A black matrix color picture tube was fabricated using such a photoresist material as specified by the following composition 4 and according to the same procedure as in the embodiment 1. In this case, the light irradiation for R, G and B dots was at 2–5 KLM. The diameter of the resultant holes at the center of the matrix was 0.26 mm.

| Composition 4 | |
|---|---|
| Vinylpyrrolidone copolymer (5% water solution) (trade name Collacral VL by BASF Co.) | 20 g |
| Polyacrylamide (1% water solution) | 30 g |
| 4,4'-Bisazidostilbene-2,2'-sodium disulphonate | 260 mg |
| N-β(aminoethyl)γ-aminopropyl-trimethoxysilane | 1.3 μl |

EMBODIMENT 7

A black matrix color picture tube was fabricated using such a photoresist material as specified by the following composition 5 and according to the same procedure as in the embodiment 1. In this case, the light irradiation for R, G, and B dots was at 0.5–1.5 KLM. The diameter of the resultant holes was 0.26 mm.

| Composition 5 | |
|---|---|
| Polyvinylpyrrolidone (5% water solution) | 30 g |
| Polyacrylamide (1% water solution | 75 g |
| Copolymer of maleic acid and vinylmethylether (trade name Gaufrez AN-119 by GAF Co.) (5% water solution) | 5 g |
| N-β(aminoethyl)γ-aminopropyl-trimethoxysilane | 25 μl |
| 4,4'-Bisazidostilbene-2,2-sodium disulphonate | 500 mg |

EMBODIMENT 8

A black matrix color picture tube was fabricated using such a photoresist material as specified by the following composition 6 and according to the same procedure as in the embodiment 1. In this case, the light irradiation for R, G and B dots was at 0.5–2.0 KLM. The diameter of the obtained holes at the center of the matrix was 0.26 mm.

| Composition 6 | |
|---|---|
| Polyvinylpyrrolidone (5% water solution) | 20 g |
| Polyacrylamide (1% water solution) | 50 g |
| Polyvinylalcohol (5% water solution) | 2 g |
| 4,4'-Bisazidostilbene-2,2'-sodium disulphonate | 320 mg |
| N-β(aminoethyl)γ-aminopropyl-trimethoxysilane | 16 μl |

EMBODIMENT 9

A black matrix color picture tube was fabricated using such a photoresist as specified by the following composition 7 and according to the same procedure as in the embodiment 1. In this case, however, the light irradiation for R, G and B dots was at 0.5–2.0 KLM. The diameter of the thus obtained holes at the center of the matrix was 0.26 mm.

| | | |
|---|---|---|
| Composition 7 | | |
| Polyvinylpyrrolidone | 1.7 | g |
| Gelatin | 1.0 | g |
| 4,4'-Bisazidostilbene-2,2'-sodium disulphonate | 810 | mg |
| N-β(aminoethyl)γ-aminopropyl-methyldimethoxysilane | 27 | μl |
| Water | 100 | g |

Further, another color picture tube was fabricated using a photoresist material similar to that specified by the above given composition 7, with the ratio by weight of polyvinylpyrrolidone to gelatin being 0.5:1.0 or 0.3:1.0, while the total weight percentage of the high-molecular compounds is unaltered and with the light irradiation for R, G and B dots at 0.5–2.0 KLM. The diameter of the resultant holes at the center of the mask was 0.26 mm.

EMBODIMENT 10

A black matrix color picture tube was fabricated using such a photoresist material as specified by the following composition 8 and according to the same procedure as in the embodiment 1. In this case, however, the light irradiation was at 2.0–3.0 KLM. The diameter of the obtained holes at the center of the matrix was 0.26 mm.

| | | |
|---|---|---|
| Composition 8 | | |
| Polyvinylpyrrolidone | 0.5 | g |
| Gelatin | 1.0 | g |
| 4,4'-Bisazidostilbene-2,2-sodium disulphonate | 205 | mg |
| N-β(aminoethyl)γ-aminopropyl-methyldimethoxysilane | 27 | μl |
| Water | 100 | g |

EMBODIMENT 11

Figure 4:
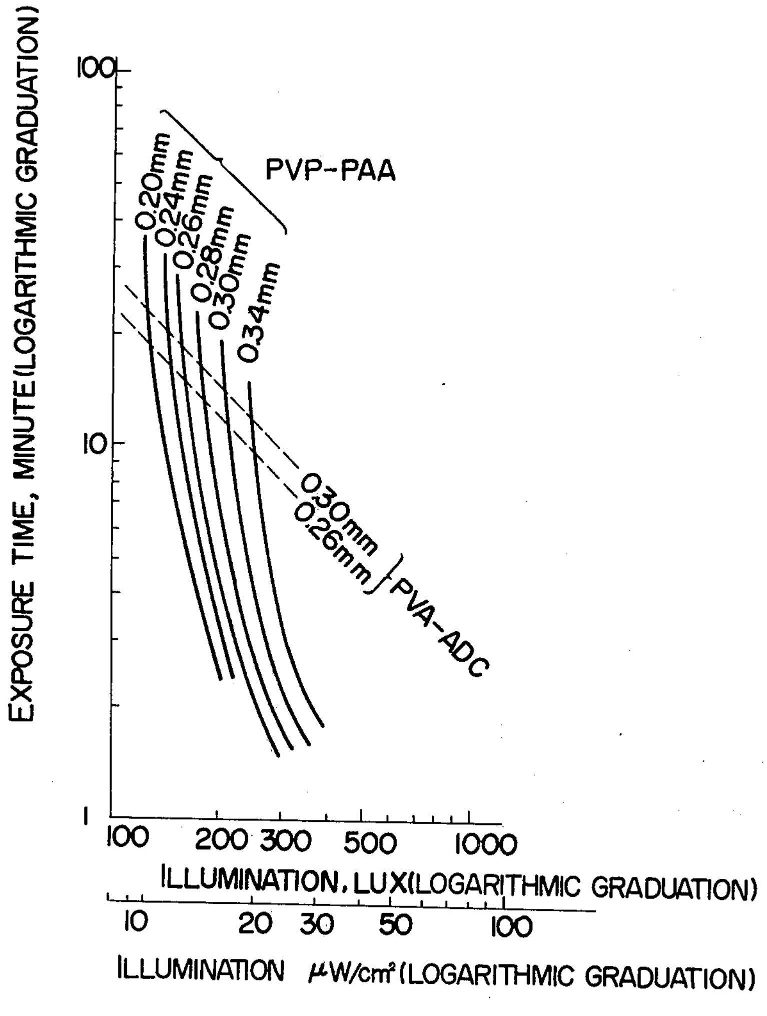
FIG. 4 shows the relations between the illumination and the exposure time required for forming beam apertures having certain predetermined diameters, for different photoresist materials.

A black matrix color picture tube was fabricated using such a photoresist material as specified by the composition 1 in the embodiment 1 and according to a procedure similar to that taken in the embodiment 1, in which the light irradiation was performed only for G dots and in which the intensity of light from the high pressure mercury vapor lamp upon the photoresist layer and the exposure time are varied. FIG. 4 shows the result of the measurement of the diameter of the holes in the black matrix prepared in the above described procedure. In FIG. 4, solid curves labelled PVP-PAA represent the relation between the exposure time and the intensity of irradiating light, viz. illumination, required to obtain a predetermined hole diameter in the black matrix, with the hole diameter varied as a parameter. The particular values attached to the respective curves are the diameters to be obtained. In FIG. 4 is also shown the result of a similar measurement with a conventional photoresist material containing 5 percent by weight of PVA-ADC by dotted curves grouped under labelling PVA-ADC. The dotted curves and the attached values represent the same relation and quantities as concerning the solid curves.

In FIG. 4, the abscissa and the ordinate are both in the logarithmic graduation and therefore it is seen that the gradient of each curve is equal to −1 times the reciprocal of the Schwartzschild's constant $p$ indicating the reciprocity-law failing property in the expression (2) given before. The ranges where the curves exist gives a practically allowable extent of the relation between the exposure time and the illumination. Within the ranges, the value of $p$ for a conventional photoresist material PVA-ADC is equal to unity, the reciprocity-law holding here, while the value of $p$ for the photoresist material specified by the previously given composition 1 lies between 0.10 and 0.70. Thus, by the use of the photoresist material specified by the composition 1 the reciprocity-law failing property favorable to the present invention can be securely, realized within a range of practicable exposure time and illumination.

The abscissa here in FIG. 4 indicates the measurement on the surface of the photoresist layer of the intensity of light from the high-pressure mercury vapor lamp with a selenium photocell, the illumination of 100 lux corresponding to the intensity of ultraviolet rays of 8 $\mu W/cm^2$, contained in the light.

EMBODIMENT 12

A black matrix color picture tube was fabricated using such a photoresist as specified by the composition 1 in the embodiment 1 and according to a procedure similar to that taken in the embodiment 1. In this case, however, the light irradiation for R, G and B dots was at 0.5–1.5 KLM with a high-pressure mercury vapor lamp used as exposure light source on a fixed platform. And a collimator having a diameter of 4 mm φ can be used while in case of the rotary platform in the embodiment 1 the diameter of the used collimetor was about 1.5 mm φ. Namely, the exposure time can be remarkably reduced to about a quarter of that required in the embodiment 1.

EMBODIMENT 13

In fabricating a black matrix color picture tube according to the same procedure as in the embodiment 1, the hypochlorite solution can be substituted by each of the following five chemically digestive agents, viz. hydrogen peroxide, potassium persulfate, potassium periodate, mixture solution of potassium dichromate and sulfuric acid and mixture solution of potassium chromate and sulfuric acid. The concentrations and the conditions for treatment of the respective agents are as follows, where solvent is water and the concentrations are all designated in percentage by weight.

| | | |
|---|---|---|
| Hydrogen peroxide | 5% 5 minute immersion | 60°C |
| Potassium persulfate | saturated 5 minute immersion | 60°C |
| Potassium periodate | 5% 10 minute immersion | 60°C |
| Mixture of potassium dichromate and sulfuric acid | 5% (each) 2 minute immersion | 50°C |
| Mixture of potassium chromate and sulfuric acid | 5% (former) and 4% (latter) 2 minute immersion | 45°C |

The diameter of holes of the black matrix color picture tube fabricated through each of the above treatments was 0.26 mm.

EMBODIMENT 14

The procedure as taken in the embodiment 1 using the photoresist material specified by the composition 1 was performed. In this case, upon completion of the step of triple exposure, the succeeding steps were suspended for 3 hours for the inspection of dark reaction. Then, the successive steps were carried out. As the result of this, the obtained black matrix color picture tube had the same characteristics as attained in the embodiment 1.

On the other hand, in case where the triple exposure was performed with PVA-ADC as a typical example of conventional photoresist materials and according to a similar procedure in which a shadow mask having a mask aperture of 0.315 mm is used, the interconnections between phosphor dots could never be prevented. This shows that the photoresist material used in the present invention is superior to that used in the conventional method, for example PVA-ADC since the crosslinkage region never increases due to dark reaction after the completion of light exposure.

EMBODIMENT 15

Phosphor dots for three primary colors were formed through light irradiation at 0.5 KLM, using such photoresist material as specified by the composition 1 in the embodiment 1 and according to the same procedure as taken in the embodiment 1. Only a difference in this case is that the light irradiation is performed with the photoresist layer in an atmosphere devoid of oxygen, for example, in nitrogen gas at 1 atm. pressure.

The diameter of thus obtained dots on the average at the center of the panel was about 0.26 mm, but the shapes of the dots are not uniform and quite different from a circle with the interconnections formed between the dots. Accordingly, it has been proved that phosphor dots for three primary colors cannot be formed without interconnection therebetween through the light irradiation, in an atmosphere devoid of oxygen, e.g. in nitrogen gas.

For the purpose of comparison, phosphor dots were formed through light irradiation at 1 KLM, using the same photoresist material and according to a similar procedure, with the photoresist material placed in the air at 1 atm. pressure. And the dots formed in this case were free from interconnections and the same as those obtained in the embodiment 1.

As described above, the advantages of the present invention are summed up as follows. First, phosphor dots having diameter smaller than that of the beam apertures of the shadow mask can be formed. Secondly, since the superposition effect of light images is eliminated by using a photoresist material having the reciprocity-law failing property, a phosphor screen for a color picture tube having a higher brightness and landing allowance can be formed without post-etching treatment, using a shadow mask having beam apertures, each of which has a diameter larger than that of each beam aperture of a shadow mask used with a conventional photoresist material. Namely, the diameter of the beam aperture of the shadow mask used in the present invention can be made more than 1.14 times larger than that of a mask required in the conventional method, to obtain phosphor dots having a predetermined constant size. Moreover, the diameter of each dot can be made more than 1.11 times larger with a mask having the same pitch and aperture diameter. And, thirdly phosphor dots having a uniform size can be formed by using such a photoresist material as described above in which crosslinkage region does not increase due to dark reaction after light exposure.

In this specification, as described above, for the convenience sake, only a method of fabricating a black matrix color picture tube is explained in which an opaque, light-absorbing layer having matrix holes is first formed and then phosphor material is applied into the matrix holes.

It is however apparent that the present invention can be applied to the case where the process of forming such a light-absorbing layer and phosphor dots is opposite to that described above and in the foregoing lines of this specification.

For example, if phosphor dots are formed according to an ordinary method of fabricating a color picture tube, using a reciprocity-law failing photoresist solution having phosphor material mixed in colloid therein, then the diameter of the formed phosphor dots can be made smaller than that of the beam apertures of the shadow mask used in the completed picture tube. Then, if the space among the thus formed phosphor dots is filled with such an opaque, light-absorbing material as carbon, a phosphor dot screen having phosphor dots having a diameter smaller than that of the beam apertures of the mated shadow mask can be fabricated.

Further, the present invention can be applied not only to the method of fabricating a color picture tube but also in the fields of an electronic industry, e.g. the fabrication of IC and LSI, printing industry, and so forth.

What we claim is:

1. A method for forming a pattern of areas of photoresist material on a surface free of interconnections between said areas comprising the steps of:

applying a reciprocity-law failing photoresist material containing a water-soluble polymer consisting of at least one of polyvinylpyrrolidone and copolymers of vinylpyrrolidone, and a water-soluble bisazide compound onto a surface on which a desired pattern is to be formed, desiccating the applied photoresist material to form a photoresist layer, placing a mask having a desired pattern of beam apertures in spaced relation to said photoresist layer, in an atmosphere containing oxygen gas irradiating by light areas of said photoresist layer through the beam apertures of said mask to form a pattern of irradiated areas on said resist layer corresponding to said desired pattern, said irradiation by light of said photoresist layer being performed under a condition that the Schwarzschild's constant p of said photoresist material is in the range: $0<\lambda p<0.76$, and developing said photoresist layer after the irradiation by light so as to form a pattern of hardened areas of said photoresist layer on said surface corresponding to the desired pattern of beam apertures, each of the hardened areas having a slightly smaller area than that of the areas of said layer actually irradiated by said light.

2. A method as claimd in claim 1, wherein the water-soluble polymer consists of polyvinylpyrrolidone.

3. A method as claimed in claim 1, wherein said reciprocity-law failing photoresist material further contains a second water-soluble polymer which has a mutual solubility with said water-soluble polymer.

4. A method as claimed in claim 3, wherein said second water-soluble polymer is one selected from among carboxylmethyl cellulose, hydroxymethyl cellulose, poly-L-sodium glutamate, gelatin, polyacrylamide, polyvinylmethylether, polyvinylalcohol, polyvinylacetal, polyethylene-oxide, a copolymer of acrylamide-diacetoneacrylamide and a copolymer of maleic acid-vinylmethylether.

5. A method as claimed in claim 1, wherein said bisazide compound is one selected from among 4,4′-diazidobenzalacetophenone-2-sulphonate; 4,4′-diazidostilbene-2,2′-disulphonate; 4,4′-diazidostilbene-γ-carboxylic acid.

6. A method as claimed in claim 1, wherein said photoresist material further contains a binding promotor.

7. A method as claimed in claim 6, wherein said binding promotor is a water-soluble functional alcoxysilane.

8. A method as claimed in claim 7, wherein said water-soluble functional alcoxysilane is one selected from the group consisting of vinyltris (β-methoxyethoxy)silane, N-β(aminoethyl)-aminopropylmethyldimethoxysilane, and N-β(aminoethyl)γ-aminopropyltrimethoxysilane.

9. A method of forming a phosphor screen for a color picture tube comprising the steps of:

applying a reciprocity-law failing photoresist material containing a water-soluble polymer consisting of at least one of polyvinylpyrrolidone and copolymers of vinylpyrrolidone, and a water-soluble bisazide compound onto the inner surface of a face panel, desiccating said photoresist material so as to form a photoresist layer on said inner surface of said face panel, placing a shadow mask having beam apertures in spaced relation to said face panel, in an atmosphere containing oxygen gas irradiating by light areas of said photoresist layer through the beam apertures of said shadow mask so as to harden areas of said layer substantially smaller than the areas of said layer actually irradiated by said light, said irradiation by light of said photoresist layer being performed under a condition that the Schwarzschild's constant p of said photoresist material is in the range of: $0<p<0.76$, developing said photoresist layer so as to remove the non-hardened areas of said layer, applying a colloidal solution of an opaque light-absorbing material onto the inner surface of said face panel carrying thereon said photoresist layer, desiccating said colloidal solution so as to form an opaque, light-absorbing layer, said layer including portions which cover said hardened areas of the photoresist layer, immersing the face panel in a chemically digestive agent to remove the hardened areas of said photoresist layer and those portions of said opaque light-absorbing layer that cover said hardened areas of said photoresist layer so that in said opaque, light-absorbing layer are formed holes whose areas are substantially smaller than the areas of said photoresist layer actually irradiated by said light, and selectively filling said holes with green-emitting phosphor, red-emitting phosphor and blue-emitting phosphor so as to form a phosphor dot screen having a pattern of phosphor dots for three primary colors, each dot having an area substantially smaller than the areas of said photoresist layer actually irradiated by said light, said dots being free of interconnections.

10. A method as claimed in claim 9, wherein the water-soluble polymer consists of polyvinylpyrrolidone.

11. A method as claimed in claim 9, wherein said opaque, light-absorbing material is carbon.

12. A method as claimed in claim 9, wherein the developing treatment is performed with water.

13. A method as claimed in claim 9, wherein said chemically digestive agent contains an acid solution of an oxidizing agent selected from among hypochloric acid, hypochlorite, hydrogen peroxide, peroxosulfuric acid, peroxosulfate, periodic acid, periodate, bichromate and chromate.

14. A method as claimed in claim 9, wherein each beam aperture of said shadow mask is in the shape of a circle.

15. A method as claimed in claim 9, wherein each beam aperture of said shadow mask is in the shape of a rectangle.

16. A method as claimed in claim 9, wherein each beam aperture of said shadow mask is in the shape of a stripe.

17. A method as claimed in claim 9, wherein said bisazide compound is one selected from among 4,4′-diazidobenzalacetophenone-2-sulphonate; 4,4′-diazidostilbene-2,2′-disulphonate; and 4,4′-diazidostilbene-γ-carbonic acid.

18. A method as claimed in claim 9, wherein said photoresist material further contains a binding promotor.

19. A method as claimed in claim 9, wherein said reciprocity-law failing photoresist material further contains a second water-soluble polymer which has a mutual solubility with said water-soluble polymer.

20. A method as claimed in claim 19, wherein said second water-soluble polymer is one selected among carboxymethyl cellulose, hydroxymethyl cellulose, poly-L-sodium glutamate, gelatin, polyacrylamide, polyvinylmethylether, polyvinylalcohol, polyvinylacetal, polyethyleneoxide, a copolymer of acrylamide-diacetoneacrylamide and vinylmethylether-maleic acid.

21. A method as claimed in claim 18, wherein said binding promotor is a water-soluble functional alcoxysilane.

22. A method as claimed in claim 21, wherein said water-soluble functional alcoxysilane is one selected from among vinyltris (β-methoxyethoxy)silane, N-β(aminoethyl)-aminopropylmethyldimethoxysilane, and N-β(aminoethyl)γ-aminopropyltrimethoxysilane.

* * * * *